United States Patent [19]
Pham et al.

[11] Patent Number: 5,283,763
[45] Date of Patent: Feb. 1, 1994

[54] MEMORY CONTROL SYSTEM AND METHOD

[75] Inventors: Giao N. Pham, Vancouver, Wash.; Kenneth C. Schmitt, Colorado Springs, Colo.

[73] Assignee: NCR Corporation, Dayton, Ohio

[21] Appl. No.: 410,773

[22] Filed: Sep. 21, 1989

[51] Int. Cl.⁵ .......... G11C 7/00; G11C 8/00; G08C 25/02; H04L 1/18
[52] U.S. Cl. .............. 365/221; 365/230.05; 365/236; 371/13; 371/32; 371/33
[58] Field of Search .......... 365/221, 230.05, 236; 371/13, 32, 33

[56] References Cited

U.S. PATENT DOCUMENTS

| | | | |
|---|---|---|---|
| 4,037,091 | 7/1977 | Beuscher | 371/13 |
| 4,051,355 | 9/1977 | Lin | 371/13 |
| 4,344,171 | 8/1982 | Lin et al. | 371/35 |
| 4,423,482 | 9/1987 | Mason | 364/200 |
| 4,535,455 | 8/1985 | Peterson | 371/13 |
| 4,598,402 | 7/1986 | Matsumoto et al. | 371/13 |
| 4,604,750 | 8/1986 | Manton et al. | 371/13 |
| 4,641,305 | 2/1987 | Joyce et al. | 371/13 |
| 4,672,614 | 6/1987 | Yoshida | 371/13 |
| 4,694,426 | 12/1983 | Hargrove et al. | 365/78 |
| 4,740,969 | 4/1988 | Fremont | 371/13 |
| 4,754,396 | 6/1988 | Horst et al. | 371/13 |
| 4,823,321 | 4/1989 | Aoyama | 365/221 |
| 4,841,439 | 6/1989 | Nishikawa et al. | 371/13 |
| 4,873,666 | 10/1989 | Lefebvre et al. | 365/236 |

*Primary Examiner*—Joseph L. Dixon
*Assistant Examiner*—Michael A. Whitfield
*Attorney, Agent, or Firm*—Douglas S. Foote

[57] ABSTRACT

A method for retransmitting selected data elements read from a memory. A first sequence of individually addressable data elements $d_1, d_2, \ldots, d_n$ are read from the memory. First and second signals indicate whether each data element was read without or with, respectively, a transmission error. A second sequence of data elements $d_i, d_{i+1}, \ldots, d_n$, where $d_i$ is the first data element of the first sequence to have a transmission error is then retransmitted.

12 Claims, 12 Drawing Sheets

MEMORY CONTROL SYSTEM AND METHOD

The present invention relates to a system and method for controlling a FIFO memory. More particularly, it relates to a system and method for retransmitting selected data elements from a such a memory.

BACKGROUND OF THE INVENTION

Microprocessors and input/output (I/O) devices often have different operating capabilities relative to their operating frequency. For example, a microprocessor may be capable of transferring data to or from an I/O device at a much faster rate than the I/O device can receive or transmit data. In order not to slow down the microprocessor, RAMs are frequently used as buffers or interface data storage elements between microprocessors and I/O devices. In this manner data can be transferred between the RAM and the microprocessor at one rate and between the RAM and I/O device at another rate.

A conventional RAM used as an interface is a first-in first-out (FIFO) buffer in which data elements (typically data bytes) are read out in the same order in which they are read into the FIFO. A dual-ported FIFO RAM allows data to be simultaneously read from and written to the buffer. Thus, a fast microprocessor can transfer data into the FIFO at its operating frequency, and a relatively slower I/O device can read the data at its operating frequency. In order to track the location of the next data byte to be written to or read from the FIFO, write and read address pointers are used. The write and read pointers are incremented on each FIFO access, and a byte count for the number of bytes of data in the FIFO is increased or decreased as the amount of data increases or decreases, respectively. The byte count is used by the microprocessor and/or I/O device to indicate when the FIFO should be read and when no more data should be transferred to the FIFO. For example, a fast microprocessor might wait until the FIFO is half full before reading data therefrom.

As with many data transfers, data elements transferred from g FIFO are checked for transmission errors. This may be accomplished by a parity check or other standard error detection technique. When an error is detected, conventional FIFOs retransmit the entire data block which contains the bad data element. Thus, no data elements in a data block may be overwritten in the FIFO until all such data elements have been successfully transferred. This reduces data throughput which may degrade system performance.

OBJECTS OF THE INVENTION

It is therefore an object of the present invention to provide a new and improved memory control system and method.

It is another object of the present invention to provide a memory control system and method for retransmitting from a memory selected data elements.

It is a further object of the present invention to provide a system and method for retransmitting from a memory only data elements having an original transmission error.

It is yet another object of the present invention to provide a memory control system for the bidirectional transfer of data between two busses.

It is yet a further object of the present invention to provide a memory control system and method with improved data throughput and increased efficiency.

SUMMARY OF THE INVENTION

One form of the present invention is a memory control system comprising a memory, first and second counters, and a connecting circuit. The first counter is connected to the memory for receiving a read signal and generates the address of the next data element to be read from the memory. The second counter receives a first signal for each data element read from the memory without a transmission error and updates the address of the last data element read from the memory without a transmission error. The circuit connects the output of the second counter to the input of first counter in response to a second signal indicating a transmission error.

Another form of the present invention is a method for retransmitting selected data elements read from a memory. A first sequence of individually addressable data elements $d_1, d_2, \ldots, d_n$ are read from the memory. First and second signals indicate whether each data element was read without or with, respectively, a transmission error. A second sequence of data elements $d_i, d_{i+1}, \ldots, d_n$, where $d_i$ is the first data element of the first sequence to have a transmission error is then retransmitted.

DESCRIPTION OF A PREFERRED EMBODIMENT

Figure 1:
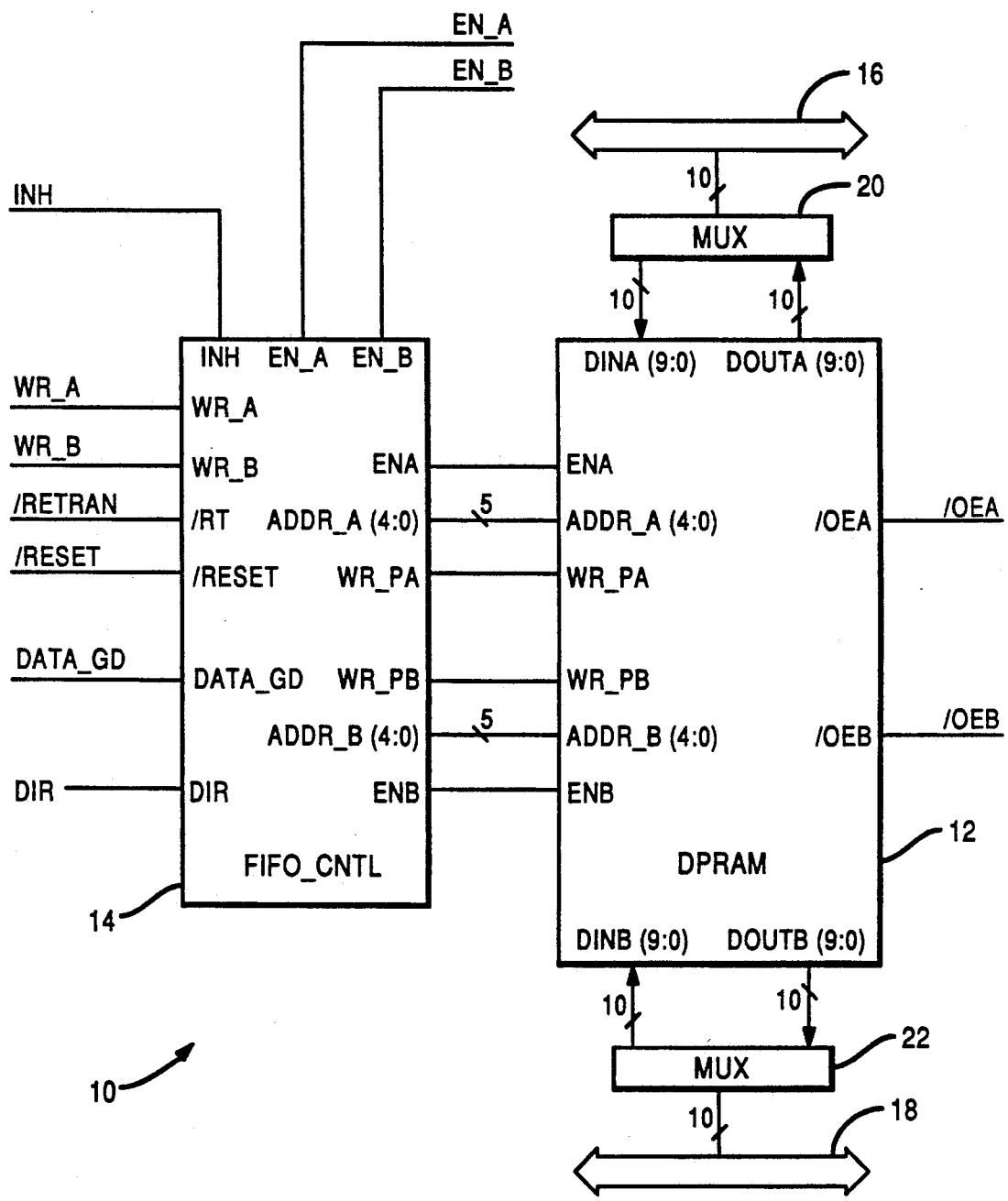
FIG. 1 is a block diagram of a memory control system according to one form of the present invention.

FIG. 1 shows a block diagram of a memory control system 10 according to one form of the present invention. System 10 includes a dual-ported FIFO random access memory (RAM) 12 and a FIFO controller 14. RAM 12 is connected between data busses 16 and 18. Data bus 16 is connected to input port A (DINA) and output port A (DOUTA) through multiplexer 20. Data bus 18 is connected to input port B (DINB) and output port B (DOUTB) through multiplexer 22. RAM 12 receives a control signal ENA or ENB to enable input port DINA or DINB, respectively, to receive data elements to be written into RAM 12. RAM 12 also receives a control signal /OEA or /OEB to enable output port DOUTA or DOUTB, respectively, for transmitting data elements being read from RAM 12. Control signals WR_PA and WR_PB are clock signals for timing data transfers through ports A and B, respectively. A write or read address is received by address port ADDR_A for data transferred through port A. A read or write address is received by address port ADDR_B for data transferred through port B.

FIFO controller 14 receives WR_A, WR_B and DIR signals. The WR_A signal indicates a write or read to port A. The WR_B signal indicates a write or read to port B. The DIR signal indicate the direction of data transfer. For example, if DIR is low then port A is a write and port B is a read, and if DIR is high then port A is a read and port B is a write. FIFO controller 14 also receives /RETRAN and DATA_GD signals. The DATA_GD signal indicates that a data element was transferred without error from RAM 12, i.e., the data is good. The /RETRAN signal indicates there was an error in the transfer and that the data element must be retransmitted. FIFO controller 14 also receives /RESET and INH signals. The /RESET is a conventional reset signal and the INH is an inhibit signal which will be discussed later.

Figure 2A:
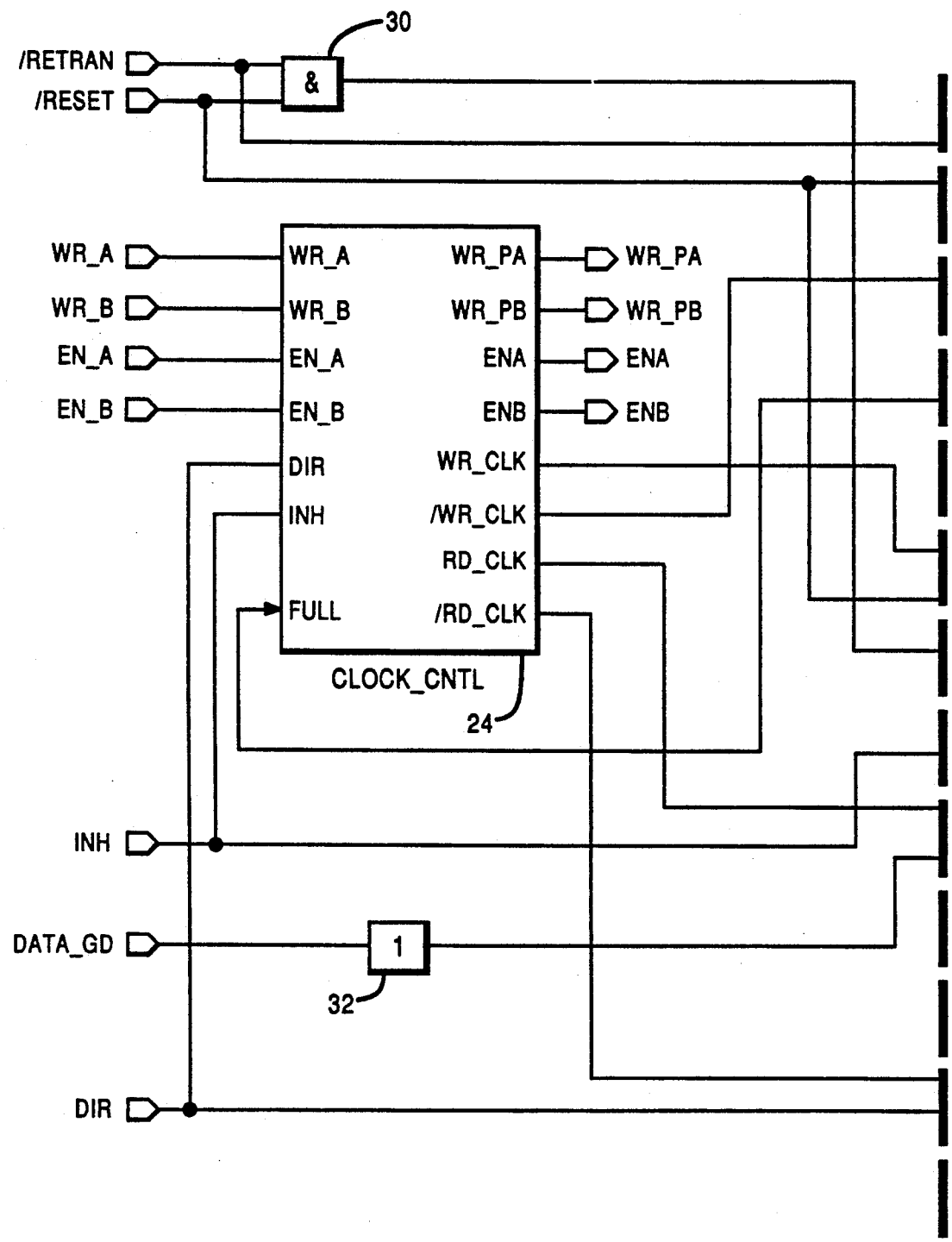
FIGS. 2A and 2B are a block diagram of the FIFO controller shown in FIG. 1.
Figure 2B:
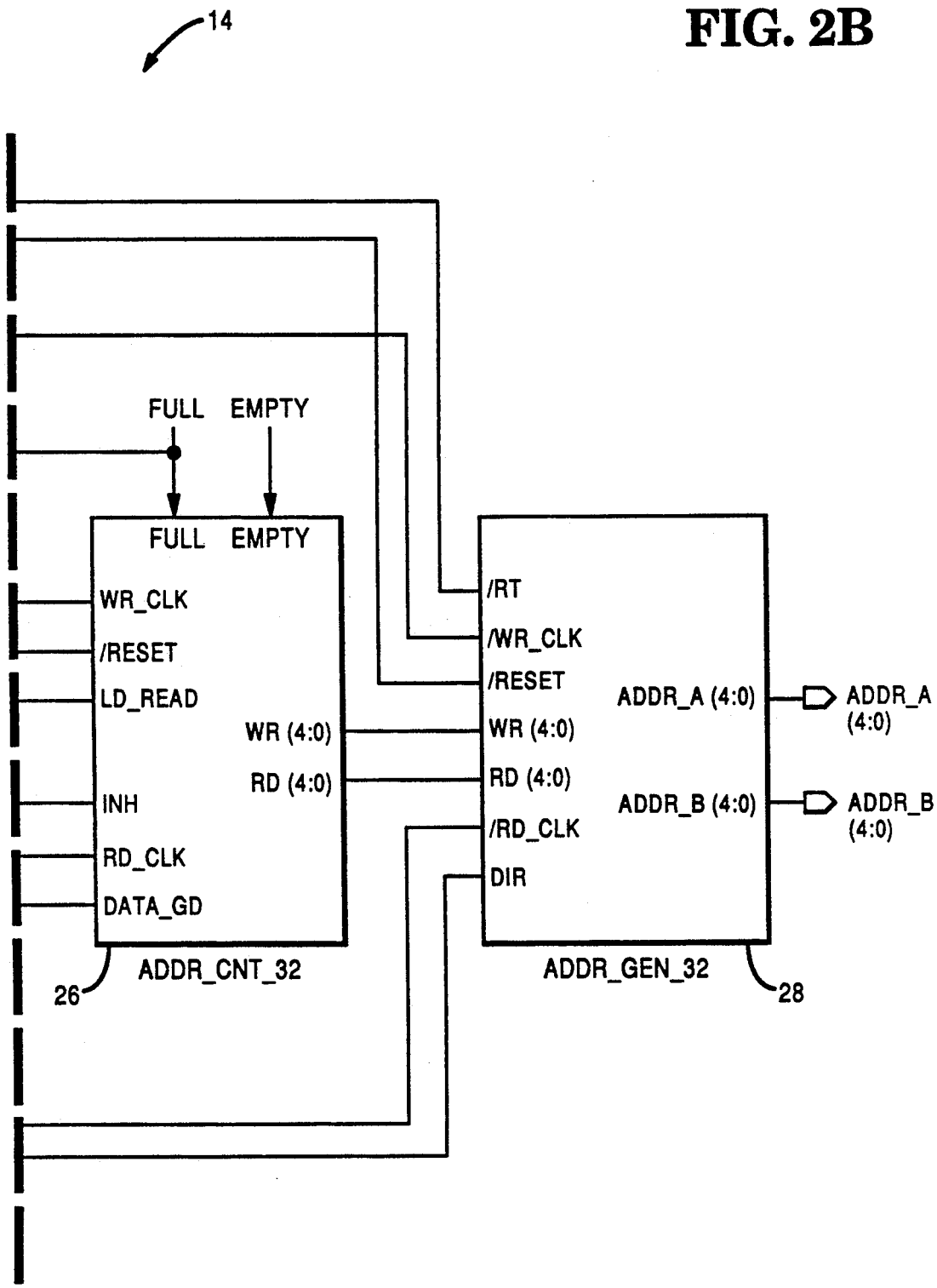

FIGS. 2A and 2B show a block diagram of FIFO controller 14 of FIG. 1. FIFO controller 14 includes a clock control circuit 24, address counter 26 and address generator 28. Clock control circuit 24 receives some of the control signals described above. In addition, circuit 24 receives a FULL signal. This signal is provided whenever RAM 12 is full and may be generated in a number of ways. For example, U.S. patent application Ser. No. 07/331,917, now U.S. Pat. No. 5,267,191 hereby incorporated by reference, discloses a circuit for generating a FULL signal. It will also be noted that address counter 26 receives an EMPTY signal which is asserted whenever RAM 12 is empty. The EMPTY signal may also be generated by a circuit such as described in the referenced U.S. Patent Application.

FIG. 2A shows an AND gate 30 which receives as inputs the /RETRAN and /RESET signals and generates a LD_READ signal on its output. The LD_READ signal will be discussed more fully with reference to FIGS. 4A-4D. The DATA_GD signal is provided to address counter 26. As shown in FIGS. 4C and 4D, the DATA_GD signal must drive a number of gates. In order to increase the signal drive and prevent excessive delay due to the high fanout of the signal, buffer 32 is provided.

Figure 3:
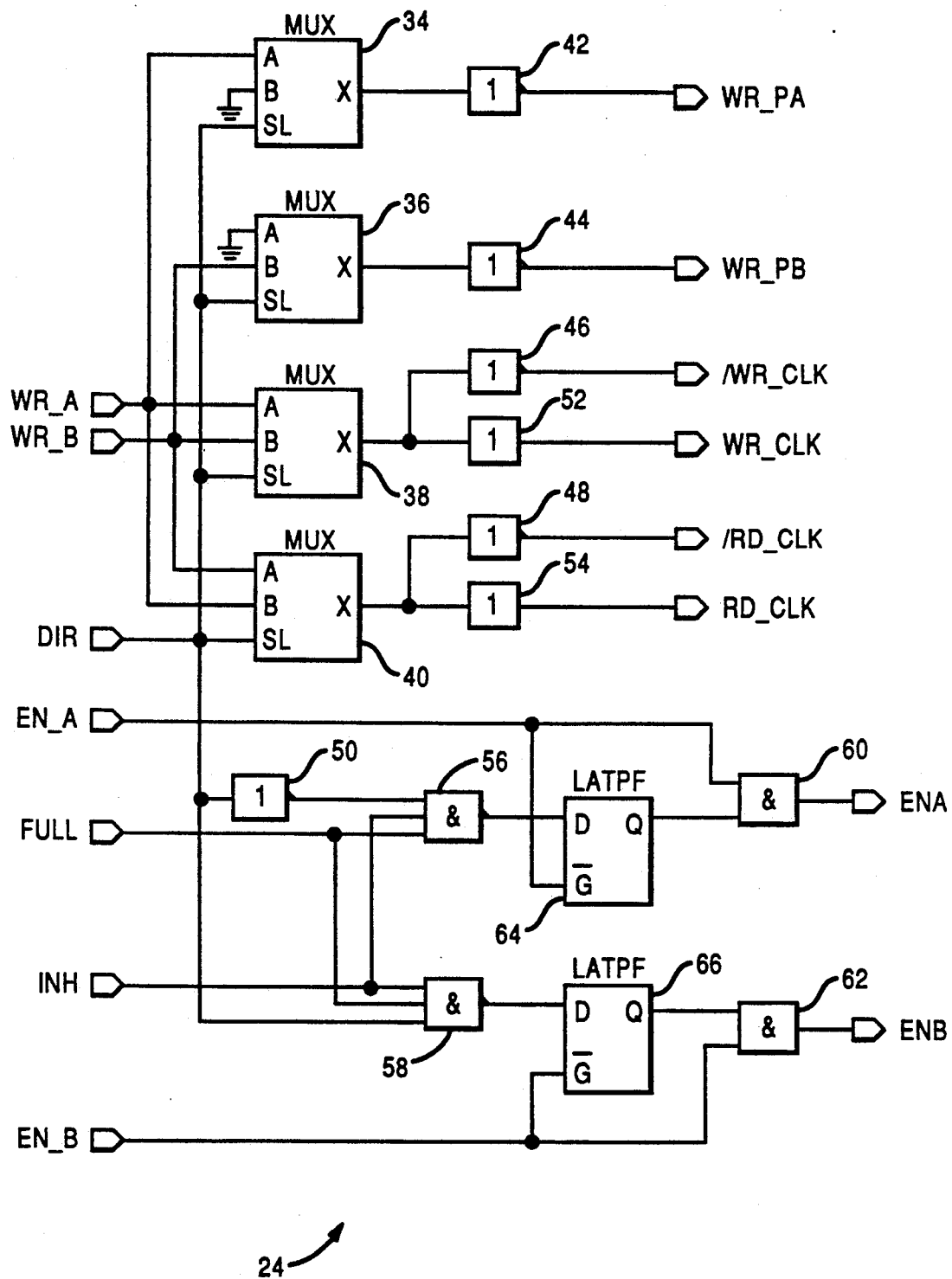
FIG. 3 is a circuit diagram of the clock control circuit shown in FIG. 2A.

FIG. 3 shows more detail of clock control circuit 24. Circuit 24 includes multiplexers 34, 36, 38 and 40, inverters 42, 44, 46, 48 and 50, buffers 52 and 54, NAND gates 56 and 58, AND gates 60 and 62, and latches 64 and 66. The WR_A signal, which indicates a write or read to port A is received by the A and B inputs to multiplexers 38 and 40, respectively. Similarly, the WR_B signal, which indicates a write or read to port B is received by the B and A inputs to multiplexers 38 and 40, respectively. The DIR signal, which indicates the direction of data transfer, is received by the select SL input of multiplexers 38 and 40. In this manner, the WR_CLK and RD_CLK signals are generated. Their inverses, /WR_CLK and /RD_CLK, are provided at the output of inverters 46 and 48. The WR_A signal is also provided to the A input of multiplexer 34, and the WR_B signal is provided to the B input of multiplexer 36. The B and A inputs of multiplexers 34 and 36, respectively, are grounded. The application of the DIR signal to the SL input provides either WR_PA or WR_PB at the output of inverters 42 or 44, respectively, depending upon which port is being written to.

Clock control circuit 24 prevents short ENA or ENB pulses when the FULL signal is asserted. For example, suppose the inhibit signal is not asserted (INH=1), and port A is configured for a write and port B for a read (DIR=0). The output of NAND gate 58 will be a "1" and the ENB signal will "follow" the EN_B signal through AND gate 62, i.e., port B will be enabled to read when EN_B goes high. The output of NAND gate 56 will also normally be a "1" when RAM 12 is not full (the FULL signal is low), so that ENA will "follow" EN_A through AND gate 60. However, on the cycle where RAM 12 becomes full (the FULL signal goes to "1"), ENA will not be inhibited until the EN_A signal goes low at the end of the cycle. This is due to the fact that the output of latch 64 will not go low until its input gate receives the low going EN_A signal.

Clock control circuit 24 also disables the FULL signal when the INH signal is asserted low. When the INH signal is active low, the input to both latches 64 and 66 will always be high. Under such conditions, the FULL signal will have no effect on the ENA signal.

Figure 4A:
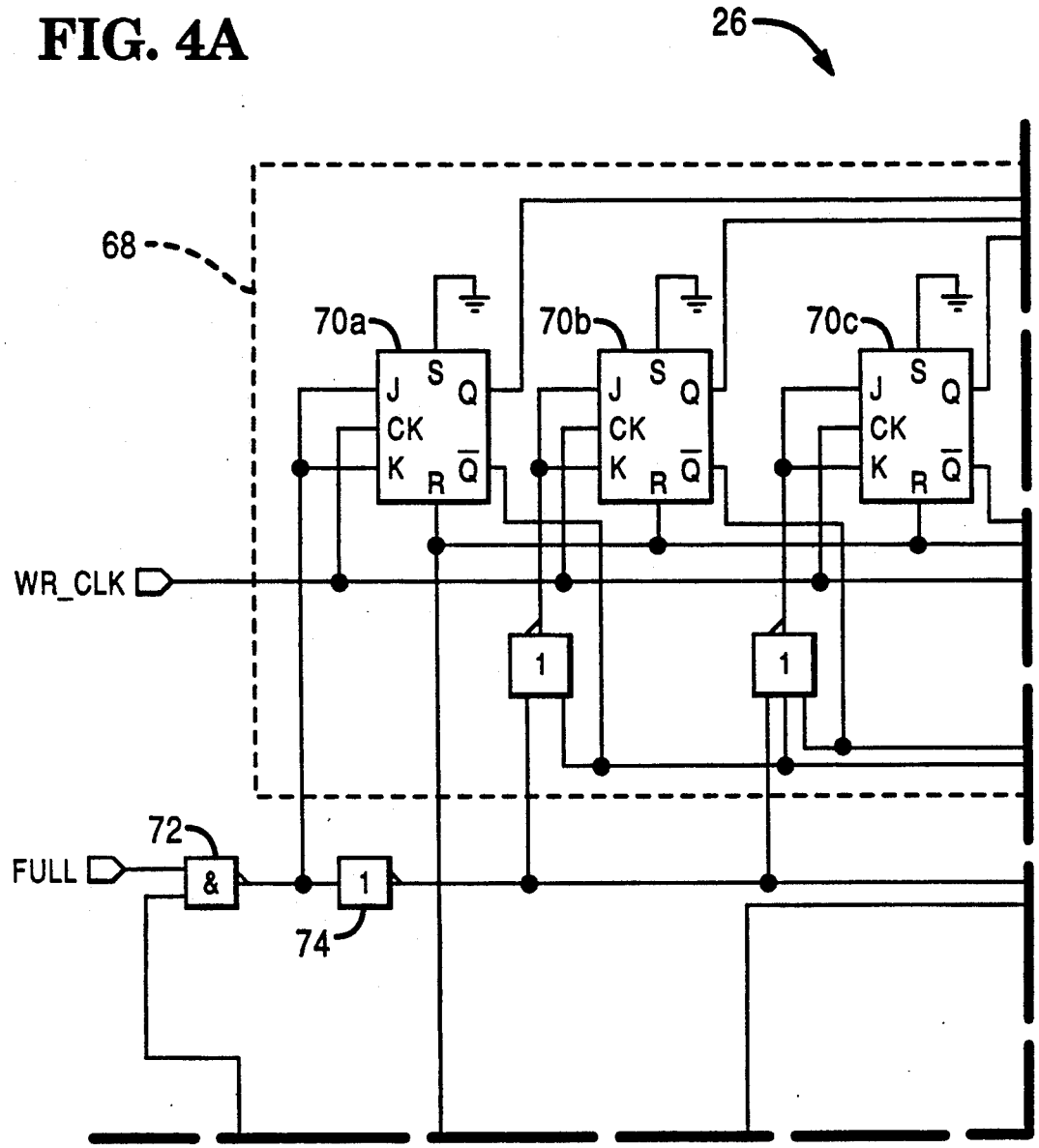
FIGS. 4, 4A through 4D are a circuit diagram of the address counter shown in FIG. 2B.
Figure 4:
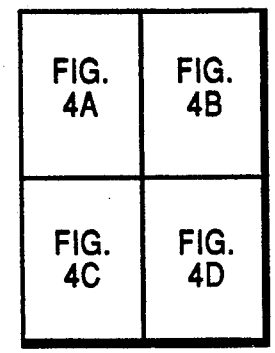
Figure 4B:
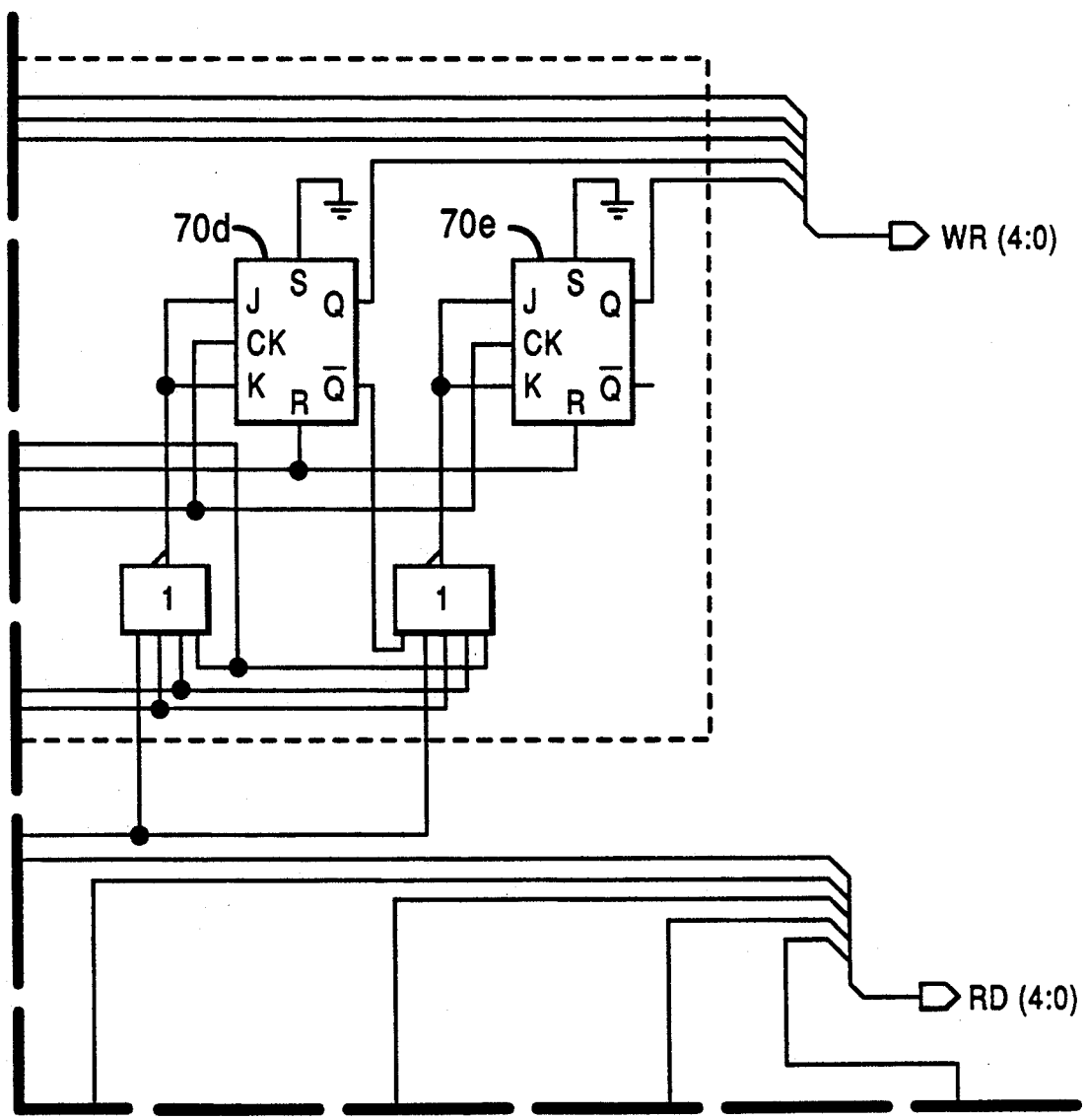
Figure 4C:
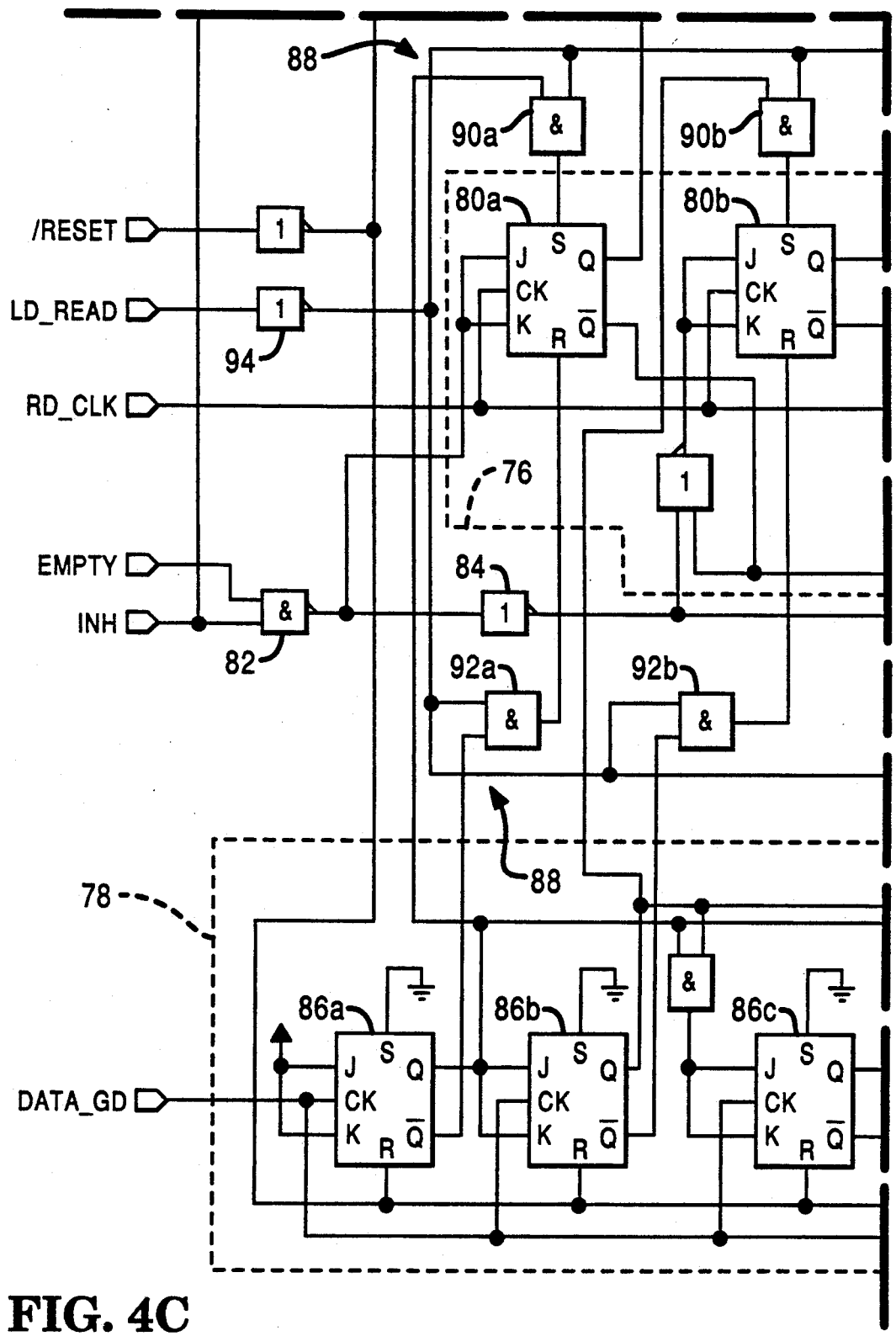
Figure 4D:
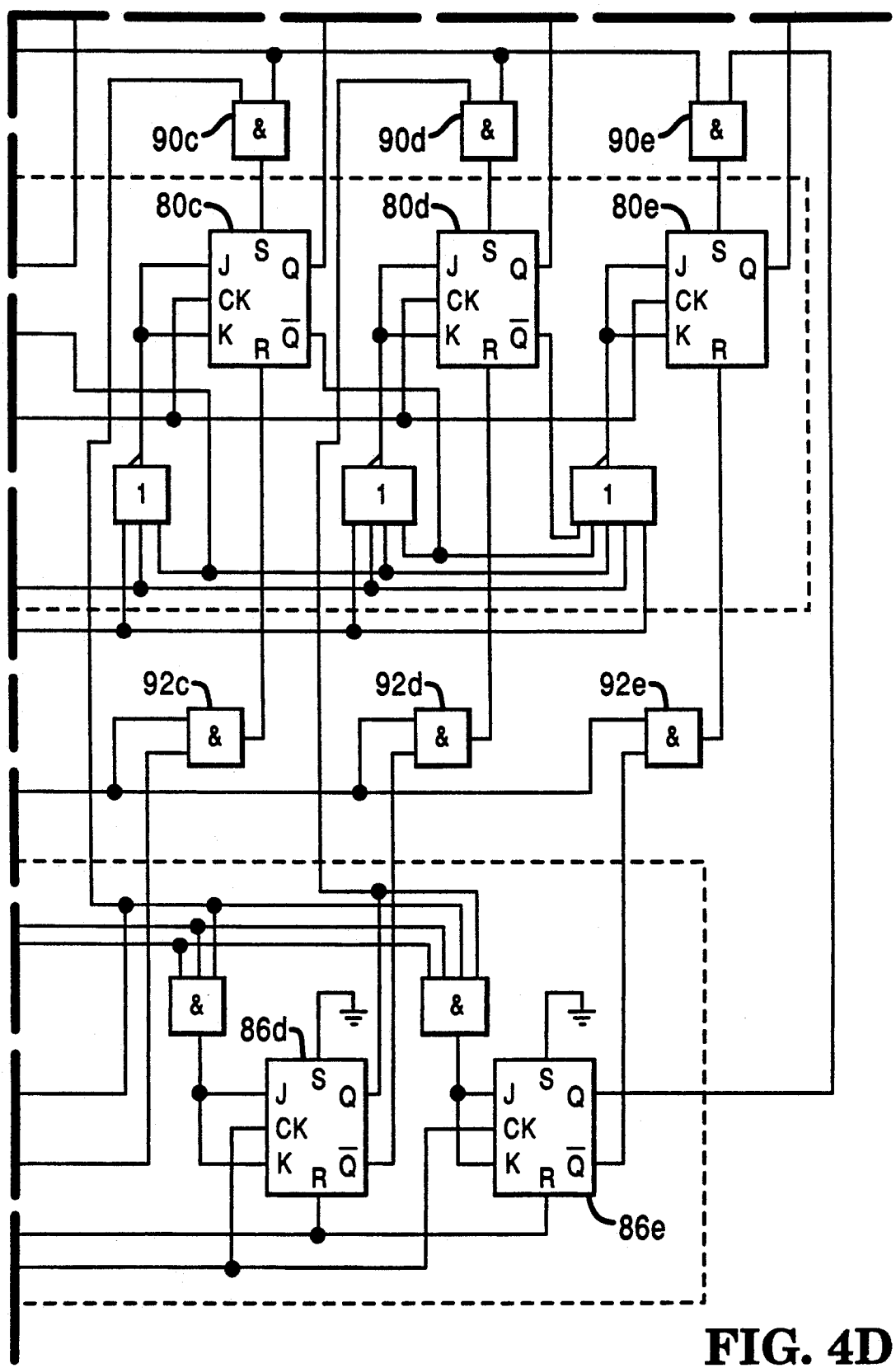

FIGS. 4A-4D show an exemplary circuit embodiment of address counter 26. FIGS. 4A-4B show a synchronous up counter 68. Counter 68 includes five JK flip-flops 70a, 70b, 70c, 70d and 70e which provide addresses for thirty-two data elements. Additional flip-flops may be added to accommodate larger RAM storage capacity. Address counter 68 is the write counter for memory control system 10, storing the write address for the next data element to be written into RAM 12. Associated with address counter 68 is NAND gate 72 and inverter 74. NAND gate 72 receives the FULL and INH signal. Asserting the FULL signal prevents counter 68 from incrementing. The INH signal is provided to allow the user to inhibit the FULL signal. In other words, whenever the INH signal is low, the FULL signal will be ignored and counter 68 will continue to increment upon receipt of WR_CLK signals.

FIGS. 4C-4D show synchronous up counters 76 and 78. Counter 76 includes five JK flip-flops 80a, 80b, 80c, 80d and 80e which provide addresses for thirty-two data elements. As with counter 68, additional flip-flops may be added to counter 76 to accommodate larger RAM storage capacity. Address counter 76 is the read counter for memory control system 10, storing the read address for the next data element to be read from RAM 12. Associated with address counter 76 is NAND gate 82 and inverter 84. NAND gate 82 receives the EMPTY and INH signal. Asserting the EMPTY signal prevents counter 76 from incrementing. The INH signal is provided to allow the user to inhibit the EMPTY signal. In other words, whenever the INH signal is low, the EMPTY signal will be ignored and counter 76 will continue to increment upon receipt of RD_CLK signals.

Counter 78 includes five JK flip-flops 86a, 86b, 86c, 86d and 86e which provide addresses for thirty-two data elements. As with counters 68 and 76, additional flip-flops may be added to counter 78 to accommodate larger RAM storage capacity. Address counter 78 tracks the address of the last data element transmitted from RAM 12 without error. In other words, every time a data element is transferred from RAM 12, the receiving device checks the data element (as with a parity check). If the data element has been read without a transmission error (i.e., the data element is valid), the receiving device transmits a DATA_GD signal to memory control system 10. When the DATA_GD signal is received, counter 78 increments, thereby updating the address of the last data element read from RAM 12 without a transmission error. Counter 78 actually stores the address of the next data element for which either a DATA_GD or /RETRAN signal will be received.

Address counter 26 further includes a circuit 88 for connecting the output of counter 78 to counter 76 in response to the LD_READ signal which indicates a transmission error. Circuit 88 includes two input AND gates 90a, 90b, 90c, 90d, 90e, 92a, 92b, 92c, 92d and 92e. One input of each of these AND gates receives the LD_READ signal inverted by inverter 94. Referring back to FIGS. 2A and 2B, LD_READ will become active low whenever the /RETRAN signal is asserted. Thus, when LD_READ is active low, the output of inverter 94 is high. The other inputs to AND gates 90a, 90b, 90c, 90d and 90e are connected to the Q outputs of flip-flops 86a, 86b, 86c, 86d and 86e, respectively. The other inputs to AND gates 92a, 92b, 92c, 92d and 92e are connected to the /Q outputs of flip-flops 86a, 86b, 86c, 86d and 86e, respectively. In this manner, whenever LD_READ is active low, the contents of flip-flops 86a, 86b, 86c, 86d and 86e will be transferred to flip-flops 80a, 80b, 80c, 80d and 80e.

Write counter 68 and read counter 76 are each connected to RAM 12 through address generator 28. Address generator 28 stores the write and read addresses for the data element transferred to or from RAM 12 upon receipt of the WR_A and/or WR_B signals. This allows data elements to be transferred to or from RAM 12 without waiting for write counter 68 or read counter 76 to increment. Write counter 68 receives the write signal WR_CLK and generates the address of the next data element to be written to RAM 12 at the same time a data transfer is taking place. Similarly, read counter 76 receives the read signal RD_CLK and generates the address of the next data element to be read from RAM 12 at the same time a data transfer is taking place.

Figure 5:
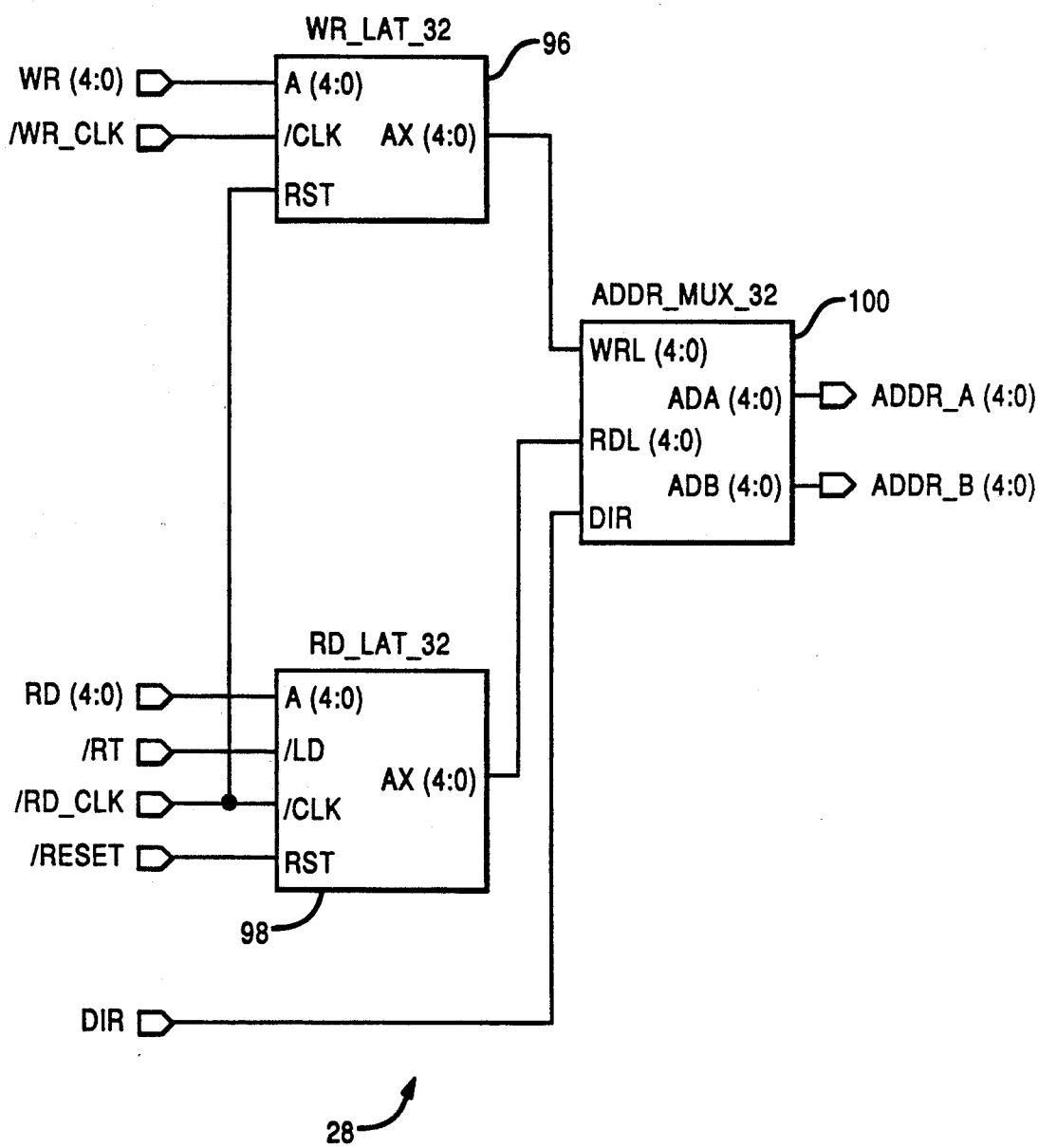
FIG. 5 is a block diagram of the address generator shown in FIG. 2B.

FIG. 5 shows a block diagram of address generator 28 shown in FIG. 2B. Generator 28 includes latches 96 and 98 and multiplexer 100. Latch 96 is connected between the output WR(4:0) of counter 68 and RAM 12. Latch 96 receives the inverted write signal /WR_CLK and stores the address of the next data element to be written to RAM 12. The write address is stored on the rising (trailing) edge of the /WR_CLK signal. Latch 98 is connected between the output RD(4:0) of counter 76 and RAM 12. Latch 98 receives the inverted read signal /RD_CLK and retransmit signal /RT and stores the address of the next data element to be read from RAM 12. The read address is stored on either the rising (trailing) edge of the /RD_CLK signal or the rising (trailing) edge of the /RT signal. The outputs of latches 96 and 98 are provided to the WRL and RDL inputs of multiplexer 100. The DIR signal determines whether the write address will be provided to port A (ADDR_A) or port B (ADDR_B), respectively, of RAM 12, and, whether the read address will be provided to port B (ADDR_B) or port A (ADDR_A), respectively.

Figure 6:
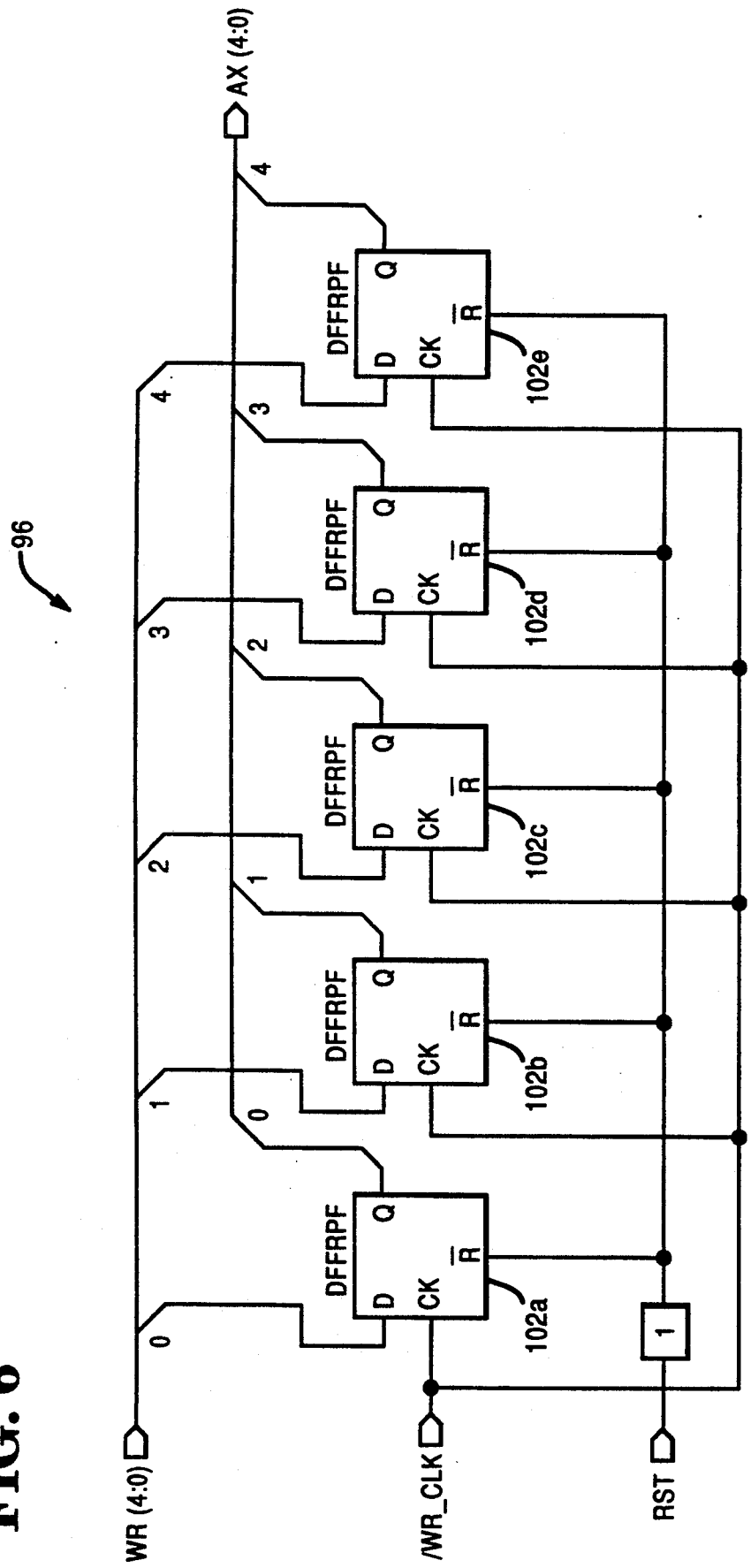
FIG. 6 is a circuit diagram of the write latch shown in FIG. 5.

FIG. 6 shows an exemplary embodiment of latch 96 shown in FIG. 5. Latch 96 comprises five flip-flops 102a, 102b, 102c, 102d and 102e. The clock input CK of each flip-flop 102a, 102b, 102c, 102d and 102e receives the /WR_CLK signal generated by clock control circuit 24. It will be noted from FIG. 4A that counter 68 is incremented upon receipt of the WR_CLK signal (inverse of /WR_CLK). Thus, counter 68 responds to the rising edge (leading edge) of the WR_CLK signal and latch 96 responds to the rising edge of /WR_CLK (which corresponds to the trailing edge of the WR_CLK signal).

Figure 7:
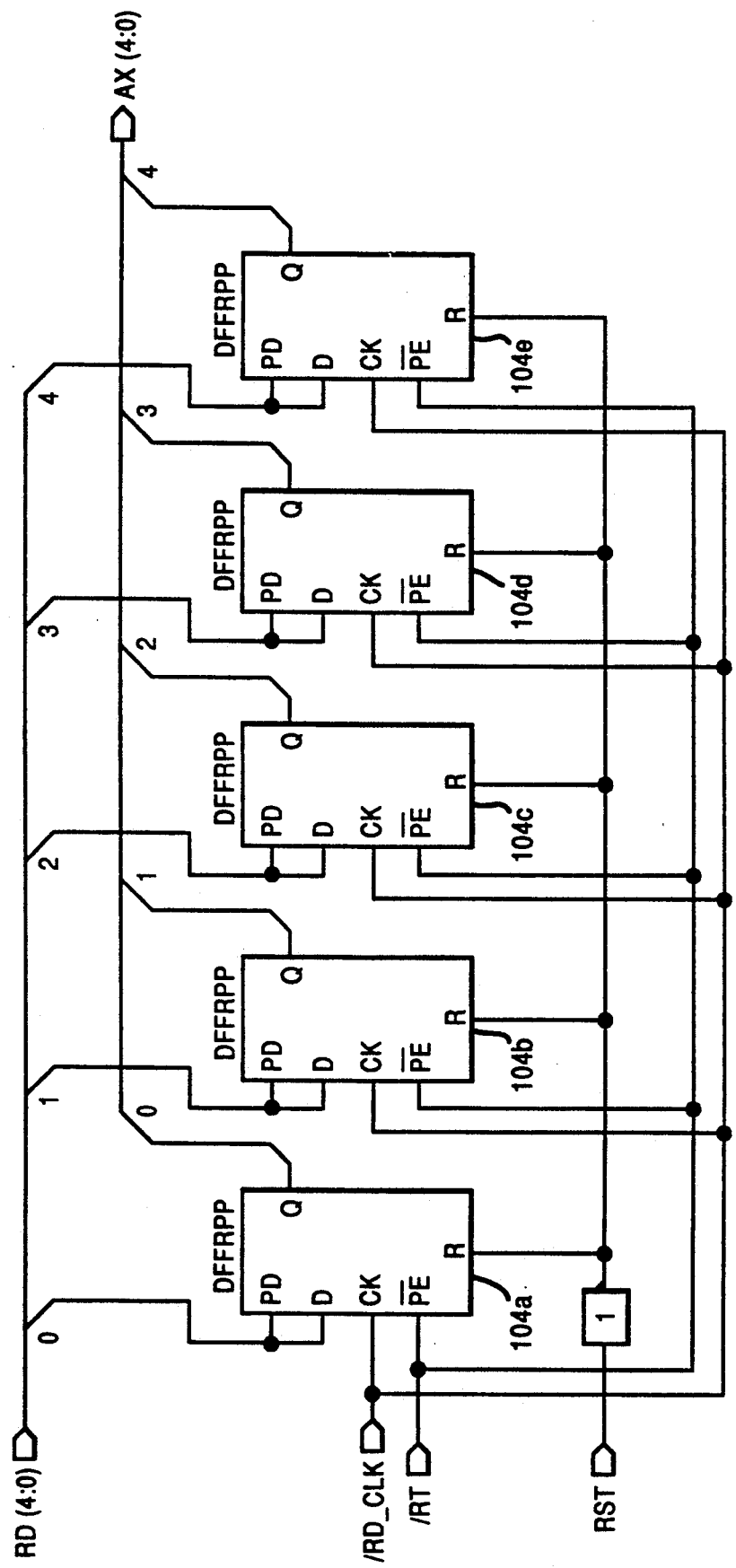
FIG. 7 is a circuit diagram of the read latch shown in FIG. 5.

FIG. 7 shows an exemplary embodiment of latch 98 shown in FIG. 5. Latch 98 comprises five flip-flops 104a, 104b, 104c, 104d and 104e. The clock input CK of each flip-flop 104a, 104b, 104c, 104d and 104e receives the /RD_CLK signal generated by clock control circuit 24. It will be noted from FIG. 4C that counter 76 is incremented upon receipt of the RD_CLK signal (inverse of /RD_CLK). Thus, counter 76 responds to the rising edge (leading edge) of the RD_CLK signal and latch 98 responds to the rising edge of /RD_CLK (which corresponds to the trailing edge of the RD_CLK signal). Each flip-flop 104a, 104b, 104c, 104d and 104e has a /PE input for receiving the /RT signal. As noted previously with reference to FIGS. 4A-4D, when the /RETRAN signal becomes active low, the inverted LD_READ signal for address counter 26 goes high, thereby transferring the contents of counter 78 into counter 76. Referring again to FIG. 7, when the /RETRAN (/RT) signal goes low, read latch 98 does not respond. However, when /RT goes high, latch 98 latches the contents of counter 76 on the positive edge of the signal.

Figure 8:
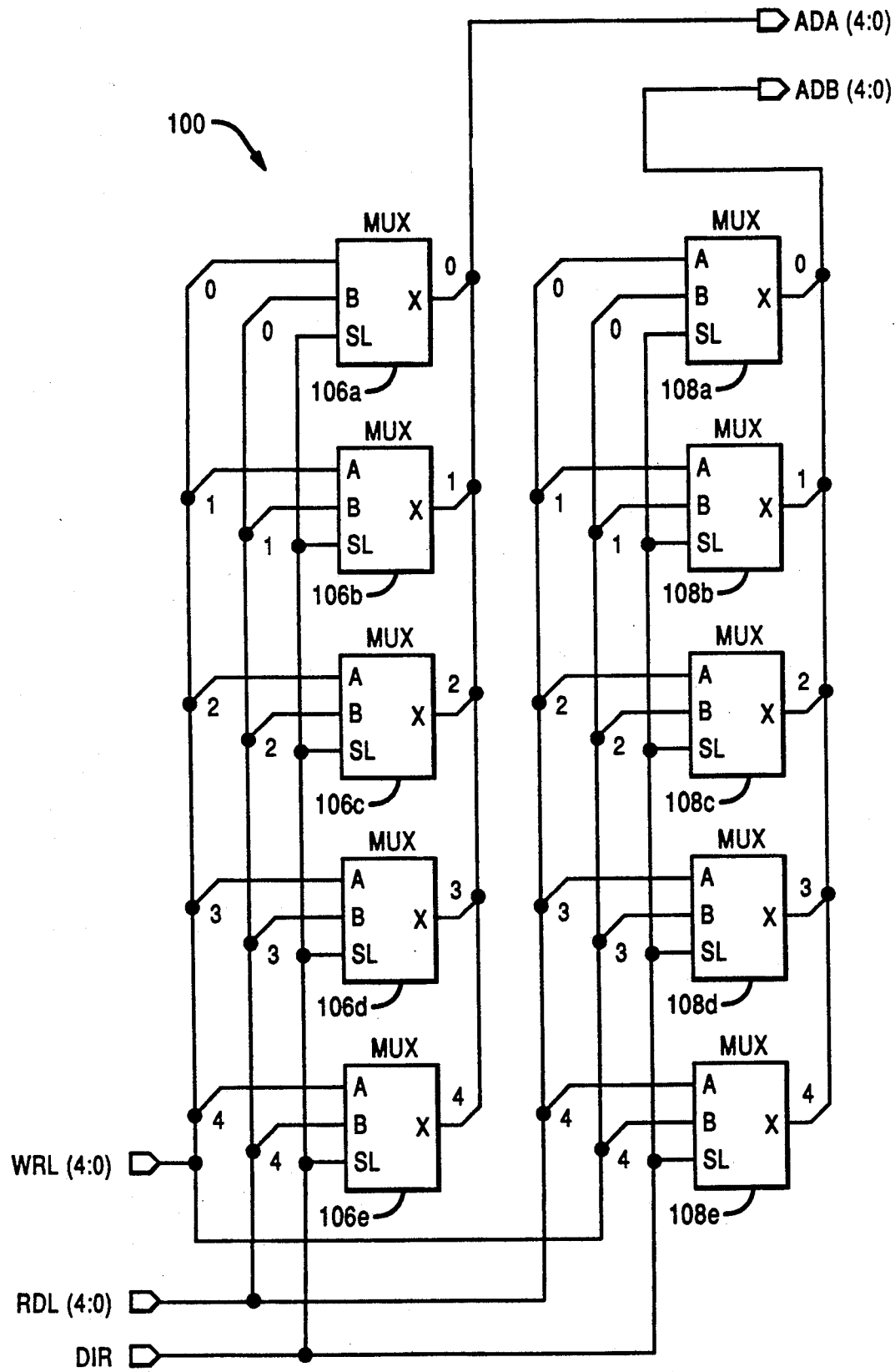
FIG. 8 is a circuit diagram of the address multiplexer shown in FIG. 5.

FIG. 8 shows an exemplary embodiment of address multiplexer 100 shown in FIG. 5. Multiplexer 100 includes single bit multiplexers 106a, 106b, 106c, 106d, 106e, 108a, 108b, 108c, 108d and 108e. The output lines of write latch 96 (FIG. 6) are connected to respective A inputs of multiplexers 106a, 106b, 106c, 106d and 106e, and to respective B inputs of multiplexers 108a, 108b, 108c, 108d and 108e. Similarly, the output lines of read latch 98 (FIG. 7) are connected to respective B inputs of multiplexers 106a, 106b, 106c, 106d and 106e, and to respective A inputs of multiplexers 108a, 108b, 108c, 108d and 108e. The DIR signal is connected to the SL input of multiplexers 106a, 106b, 106c, 106d, 106e, 108a, 108b, 108c, 108d and 108e, thereby providing the write address to port A and the read address to port B or vice versa, depending upon the direction of data transfer through RAM 12.

In operation, the direction of data transfer through RAM 12 will be configured by the DIR signal. For example, if DIR is low then data elements may be written to port A and read from port B. With control system 10 reset and the port A enable signal EN_A active, a first data byte or element may be written to RAM 12 by strobing the WR_A signal. Clock control circuit 24 (FIG. 3) will generate the /WR_CLK and WR_CLK signals. Upon receipt of the leading edge of the WR_CLK signal, write counter 68 (FIGS. 4A-4B) will increment to 00001. At the same time, the address 00000 (as initially reset) in latch 96 (FIG. 6) will appear on the ADDR_A port of RAM 12, and the first data element may be written into RAM 12. On the trailing edge of /WR_CLK, address 00001 will be transferred from counter 68 to latch 96. A next data element may then be written into RAM 12 by again strobing the WR_A signal.

In a similar manner, data may be read from RAM 12. A first data byte or element may be read from RAM 12 by strobing the WR_B signal. Clock control circuit 24 (FIG. 3) will generate the /RD_CLK and RD_CLK signals. Upon receipt of the leading edge of the RD_CLK signal, read counter 76 (FIGS. 4C-4D) will increment to 00001. At the same time, the address 00000 (as initially reset) in latch 98 (FIG. 7) will appear on the ADDR_B port of RAM 12, and the first data element may be read. On the trailing edge of /RD_CLK, address 00001 will be transferred from counter 76 to latch 98. A next data element may then be read from RAM 12 by again strobing the RD_A signal. in this manner, a sequence of individually addressable and sequentially stored data elements $d_1, d_2, \ldots, d_n$, may be read from RAM 12.

As each data element $d_i$ is received by a device connected to data bus 18 a check of the validity of that element may be made. For example, a parity check can reveal whether there was an error in the transmission of that data element. For every data element transmitted without error, the receiving device will return a DATA_GD signal to control system 10. Counter 78 will increment on receipt of the DATA_GD signal and will continue to increment each time the DATA_GD signal is strobed. If an error is detected in the transmission of a data element $d_i$ from RAM 12, the receiving device will return a /RETRAN signal to control system 10. The /RETRAN signal will be received as the LD_READ signal by circuit 88 (FIGS. 4C-4D). The contents of counter 78 are transferred to read counter 76 on the leading edge of the LD_READ signal. On the trailing edge of the /RT signal the address in counter 76 is transferred to latch 98. When WR_B is again strobed, data element $d_i$ will be retransmitted followed on subsequent reads by data elements $d_{i+1}, d_{i+2}, \ldots, d_n$.

It will be clear to those skilled in the art that the present invention is not limited to the specific embodiment disclosed and illustrated herein. Numerous modifications, variations, and full and partial equivalents can be undertaken without departing from the invention as limited only by the spirit and scope of the appended claims.

What is desired to be secured by Letters Patent of the United States is as follows.

What is claimed is:

1. A memory control system comprising:
   a memory;
   a first counter connected to said memory for receiving a read signal and generating the address of the next data element to be read from said memory;
   a second counter for receiving a first signal for each data element read from said memory without a transmission error and generating the address of the last data element read from said memory without a transmission error; and
   a circuit for transferring the address in said second counter to said first counter in response to a second signal indicating a transmission error.

2. The system of claim 1 wherein said memory is a dual ported FIFO random access memory.

3. The system of claim 1 further comprising:
   a third counter connected to said memory for receiving a write signal and generating the address of the next data element to be written to said memory.

4. The system of claim 1 further comprising:
   a first latch connected between said first counter and said memory for receiving said read and second signals, and in response to either signal storing the address of the next data element to be read from said memory;
   wherein said first counter responds to the leading edge of each of said read and second signals and said first latch responds to the trailing edge of each of said read and second signals.

5. The system of claim 3 further comprising:
   a first latch connected between said third counter and said memory for receiving said write signal and in response thereto storing the address of the next data element to be written to said memory;
   wherein said third counter responds to the leading edge of said write signal and said first latch responds to the trailing edge of said write signal.

6. A memory control system comprising:
   first means for transmitting a first sequence of individually addressable data elements $d_1, d_2, \ldots, d_n$ from memory locations addressed by the output of a counter; and
   second means for retransmitting from said memory a second sequence of data elements $d_i, d_{i+1}, \ldots, d_i$ is the first date element of said first sequence to have a transmission error;
   wherein said first means includes a first counter connected to said memory for receiving a read signal and generating the address of the next data element to be read; and
   wherein said second means includes a second counter for generating the address of the last data element read from said memory without a transmission error.

7. The system of claim 6 wherein said second counter receives a signal for each data element read without a transmission error.

8. The system of claim 7 further comprising:
   a circuit for transferring the address in said second counter to said first counter in response to a signal indicating a transmission error.

9. A memory control system comprising:
   a dual ported FIFO random access memory;
   a first counter for receiving a read signal and generating the address of the next data element to be read from said memory;
   a second counter for receiving a first signal for each data element read from said memory without a transmission error and generating the address of the last data element read from said memory without a transmission error;
   a third counter connected to said memory for receiving a write signal and generating the address of the next data element to be written to said memory;
   a circuit for transferring the address in said second counter to said first counter in response to a second signal indicating a transmission error;
   a first latch connected between said first counter and said memory for receiving said read and second signals, and in response to either signal storing the address of the next data element to be read from said memory; and
   a second latch connected between said third counter and said memory for receiving said write signal and in response thereto storing the address of the next data element to be written to said memory;
   wherein said first counter responds to the leading edge of each of said read and second signals and said first latch responds to the trailing edge of each of said read and second signals; and
   wherein said third counter responds to the leading edge of said write signal and said second latch responds to the trailing edge of said write signal.

10. A method for retransmitting selected data elements read from a memory comprising:
    reading a first sequence of individually addressable data elements $d_1, d_2, \ldots, d_n$ from said memory at addresses generated by a counter;

providing first and second signals indicating whether each data element was read without or with, respectively, a transmission error; and retransmitting a second sequence of data elements $d_i, d_{i+1}, \ldots, d_n$, where $d_i$ is the first data element of said first sequence to have a transmission error wherein said reading step includes:

providing a reading signal for each data element to be read; and counting each read signal to generate a read address for said memory.

11. A method for retransmitting selected data elements read from a memory comprising:

reading a first sequence of individually addressable data elements $d_1, d_2, \ldots, d_n$ from said memory at addresses generated by a counter;

providing first and second signals indicating whether each data element was read without or with, respectively, a transmission error; and retransmitting a second sequence of data elements $d_i, d_{i+1}, \ldots, d_n$, where $d_i$ is the first data element of said first sequence to have a transmission error;

wherein said retransmission step includes:

counting each first signal; and providing the first signal count as a read address in response to a second signal.

12. A method for retransmitting selected data elements read from a memory comprising:

reading a first sequence of individually addressable data elements $d_1, d_2, \ldots, d_n$ from said memory, by:

providing a read signal for each data element to be read; and counting each read signal to generate a read address for said memory;

providing first and second signals indicating whether each data element was read without or with, respectively, a transmission error; and in response to said second signal, retransmitting a second sequence of data elements $d_i, d_{i+1}, \ldots, d_n$, where $d_i$ is the first data element of said first sequence to have a transmission error, by:

counting each first signal; and providing the first signal count as a read address in response to a second signal.

* * * * *

UNITED STATES PATENT AND TRADEMARK OFFICE
CERTIFICATE OF CORRECTION

PATENT NO. : 5,283,763
DATED : February 1, 1994
INVENTOR(S) : Giao N. Pham et al.

It is certified that error appears in the above-indentified patent and that said Letters Patent is hereby corrected as shown below:

Column 8, Line 14, before "$d_i$", third occurrence, insert --$d_n$, where--

Signed and Sealed this

Thirteenth Day of September, 1994

Attest:

BRUCE LEHMAN

Attesting Officer    Commissioner of Patents and Trademarks